United States Patent
Noguchi

(10) Patent No.: US 6,979,520 B2
(45) Date of Patent: Dec. 27, 2005

(54) STENCIL MASK FOR ION IMPLANTATION

(75) Inventor: Hitoshi Noguchi, Annaka (JP)

(73) Assignee: Shin Etsu Chemical Co., Ltd., Tokyo (JP)

(*) Notice: Subject to any disclaimer, the term of this patent is extended or adjusted under 35 U.S.C. 154(b) by 58 days.

(21) Appl. No.: 10/854,710

(22) Filed: May 27, 2004

(65) Prior Publication Data

US 2004/0238759 A1 Dec. 2, 2004

(30) Foreign Application Priority Data

May 27, 2003 (JP) .............................. 2003-149445

(51) Int. Cl.⁷ .............................................. G03F 9/00
(52) U.S. Cl. .................................................... 430/5
(58) Field of Search ........................... 430/5; 378/34, 378/35

(56) References Cited

U.S. PATENT DOCUMENTS 5,728,492 A * 3/1998 Kawata ..................... 430/5

FOREIGN PATENT DOCUMENTS

DE 100 39 644 A1 2/2002
EP 0 473 332 A1 3/1992

OTHER PUBLICATIONS

T. Shibata, et al., "Stencil Mask Ion Implantation Technology for High Performance MOSFETs", IEDM 2000 Proceedings, San Francisco CA (Dec. 11-13, 2000), pp. 869-871.

* cited by examiner

Primary Examiner—Saleha R. Mohamedulla
(74) Attorney, Agent, or Firm—Oliff & Berridge, PLC

(57) ABSTRACT

There is disclosed a stencil mask for ion implantation used in an ion implantation process of semiconductor device fabrication comprising at least a base material portion and a stencil portion, wherein the stencil portion has a diamond layer. Thereby, there can be provided a stencil mask for ion implantation used in an ion implantation process of semiconductor device fabrication, which has high resistance to ion irradiation, and which can stably perform ion implantation of high precision and high purity for long time.

12 Claims, 3 Drawing Sheets

F I G. 1
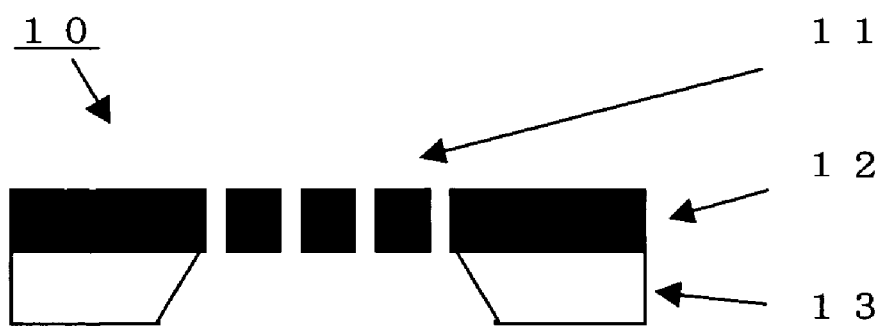

(a)  ← 26

(b)

(c)

(d)

STENCIL MASK FOR ION IMPLANTATION

BACKGROUND OF THE INVENTION

1. Field of the Invention

The present invention relates to a stencil mask for ion plantation used in an Ion Implantation process of semiconductor device fabrication.

2. Related Art

In semiconductor device fabrication, it is important to control a conductivity type and an impurity profile of a silicon single crystal substrate by introducing impurity atoms of III and V families therein. As to methods of introducing impurity atoms, a diffusion method and an ion implantation method are given for examples.

The diffusion method is to thermally diffuse desired atoms in crystal lattices of a substrate. Generally, a glass layer including impurities is formed on a substrate surface, and by a substitution due to an oxidation-reduction reaction between the glass layer and atoms in the substrate, impurity atoms are introduced into the substrate.

However, recently, in response to higher integration of LSI, further precise control of impurities (such as a junction depth and decrease in variation of resistance) has been required, and in response to mass production, improvements of repeatability and processing capacity have also been required.

Accordingly, the importance of the ion implantation method, which is the other example of impurity control methods, has been increased, and the ion implantation method has been used practically as a substitute for a conventional diffusion method. The principle of the method is that ions having high energy are collided with a substrate to bury them physically, and defects are recovered and impurities are activated as carriers by a subsequent heat treatment, When the substrate is made of silicon, ions such as B in the III family, or P, As, or Sb in the V family, for example, are implanted as impurities.

This ion implantation method is basically characterized in that masking for controlling an implantation region is possible. If a material of the mask sufficiently thicker than the range of ions to be implanted is used, the ions stop inside the mask and do not reach into the substrate under the mask. As for such a mask for ion implantation, conventionally, a method using a resist mask having a necessary thickness and formed on a desired region of a substrate by a photolithography process has been employed. However, as for a conventional resist mask produced by a photolithography, there is needed a long process in which a resist mask is formed by applying resist, exposing and developing it, and after the mask is used in an ion implantation process of semiconductor device fabrication, the resist mask no longer required is subjected to ashing for removal and cleaned in conclusion. Therefore, the reduction of processing hours has been required.

Under such a circumstance, recently, an ion implantation technique using a stencil mask for ion implantation was suggested (see "T. Shibata, et al., "Stencil Mask Ion Implantation Technology for High Performance MOSFETs", IEDM 2000 Proceedings, San Francisco, Calif. (Dec. 11–13, 2000) "). It was reported that in the ion implantation technique, shorter process time, lower manufacturing cost, and decrease in an occupied area of an apparatus to be required are achieved.

Conventional stencil masks for ion implantation have been produced from easily obtainable SOI (Silicon on Insulator) substrates, and each stencil portion is made of a silicon single crystal material. For example, the stencil mask for ion implantation described in the aforementioned reference (T. Shibata, et al.) has a structure that a stencil portion made of silicon and having a thickness of 5–10 $\mu$m in which a patter is formed is supported by a base material portion made of silicon and having a thickness of 500 $\mu$m. However, when the stencil portion is made of silicon as described above, its lifetime in practical use has come to an issue.

To be more precise, there are problems in that (1) since stress of the stencil portion made of silicon is changed by ion irradiation, its implantation precision is decreased, and (2) since bond of silicon in a stencil mask is broken, silicon atoms are implanted as impurities.

SUMMARY OF THE INVENTION

The present invention has been accomplished in view of the above-mentioned problems, and an object of the present invention is to provide a stencil mask for ion implantation used in an ion implantation process of semiconductor device fabrication, which has high resistance to ion irradiation, and which can stably perform ion implantation of high precision and high purity for a long time.

The present invention has been accomplished to solve the above-mentioned problems, and provides a stencil mask for ion implantation used in an ion implantation process of semiconductor device fabrication comprising at least a base material portion and a stencil portion, wherein the stencil portion has a diamond layer.

As described above, if the stencil mask for ion implantation in which the stencil portion has a diamond layer is used, variation of stress in the stencil portion is small and atoms in the stencil portion are not implanted as impurities into a semiconductor device even if the stencil mask is irradiated with ions for a long time in an ion implantation process of the semiconductor device fabrication. Therefore, ion implantation of high precision and high purity can be stably performed for a long time, and the effects of improvement of the production yield of a semiconductor device and decrease in the production cost can be obtained.

In this case, it is preferable that the diamond layer has a thickness within a range of 0.1–30.0 $\mu$m.

As described above, if the diamond layer has a thickness of within a range of 0.1–30.0 $\mu$m, the diamond layer is sufficiently thicker than the range of ions to be implanted. Thus, the diamond layer having the above thickness can function certainly as the stencil mask for ion implantation. Furthermore, in terms of the production cost of the diamond layer, the thickness of the above range is advantageous.

In this case, it is preferable that a whole or a part of the diamond layer comprises a diamond having electroconductive property, and the diamond having electroconductive property has an electrical resistivity of $10^{13}$ $\Omega$·cm or less at 20° C.

As described above, if a whole or a part of the diamond layer comprises a diamond having electroconductive property, and the diamond having electroconductive property has an electrical resistivity of $10^{13}$ $\Omega$·cm or less at 20° C., it is possible to certainly prevent charge storage in the stencil portion in an ion implantation process of semiconductor device fabrication, and it is also possible to perform ion implantation of high precision for a long time.

It is preferable that the diamond having electroconductive property, which constitutes a part of the diamond layer, is formed on a whole surface or a part of a surface of the diamond layer, and has a thickness of 25.0 $\mu$m or less.

As described above, if the diamonds having electroconductive property, which constitutes a part of the diamond layer, is formed on a whole surface or a part of a surface of the diamond layer, and has a thickness of 25.0 μm or less, a problem of charge storage can be sufficiently settled by the electroconductive diamond formed on the surface of the diamond layer while sufficiently utilizing an excellent characteristic of the high purity diamond in a bulk part such as high resistance to ion irradiation due to high covalent bonding strength. Moreover, for example, when a dopant is used to give electroconductive property, an amount of the dopant can be reduced. Therefore, degradation of crystallinity of the diamond can be suppressed to a minimum, and the effect of reduction in the production cost can also be obtained.

In this case, a dopant of the diamond having electroconductive property is boron or phosphorous.

As described above, if a dopant for the diamond having electroconductive property is boron or phosphorous, since the diamond can be relatively easily doped with each dopant, the electrical resistivity of the diamond can be easily controlled to a desired value.

Also, it may be possible that a material having electroconductive property other than a diamond is formed on a whole surface or a part of a surface of the diamond layer, and the material having electroconductive property has an electrical resistivity of $10^{13}$ Ω·cm or less at 20° C. and has a thickness within a range of 0.001–2.000 μm.

Even when the stencil mask for ion implantation having the above structure is used, charge storage can be prevented for a long time in an ion implantation process by the electroconductive material formed on the surface of the diamond layer., and deterioration in ion implantation precision can be prevented certainly. And since high purity diamond can be used in the diamond layer, an excellent characteristic of diamond such as high resistance to ion irradiation due to high covalent bonding strength can be sufficiently utilized.

In this case, it is preferable that the material having electroconductive property comprises a simple substance or a compound selected from the group consisting of Si, SiC, SiN, C without a diamond structure, Ti, Cr, Mo, Ru, Rh, Ag, In, Sn, Ta, W, Ir, Pt, and Au.

Since these materials having electroconductive property can surely prevent charge storage to the stencil mask for ion implantation in the ion implantation, they are sufficiently effective in that lifetime of the stencil mask can be extended.

As explained above, according to the present invention, since at least the stencil portion of the stencil mask for ion implantation has the diamond layer, the stencil mask for ion implantation has high resistance to ion irradiation. Moreover, since a whole or a part of the diamond layer, in particular, a whole surface or a part of a surface of the diamond layer in the stencil portion has a diamond having electroconductive property, decrease in the ion implantation precision due to charge storage can be prevented in ion implantation. If such a stencil mask for ion implantation is used in actual ion implantation, the ion implantation of high precision and high purity can be stably performed for long time.

BRIEF DESCRIPTION OF THE DRAWINGS

FIG. 1 is a schematic sectional view showing an example of a stencil mask for ion implantation of the present invention.

DESCRIPTION OF THE INVENTION AND A PREFERRED EMBODIMENT

Figure 2:
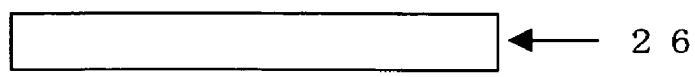
FIG. 2 includes explanatory views showing an example of a production method of the stencil mask for ion implantation.
Figure 2:
Figure 2:
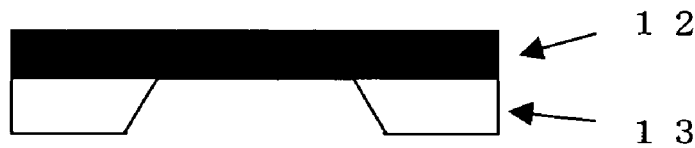
Figure 2:
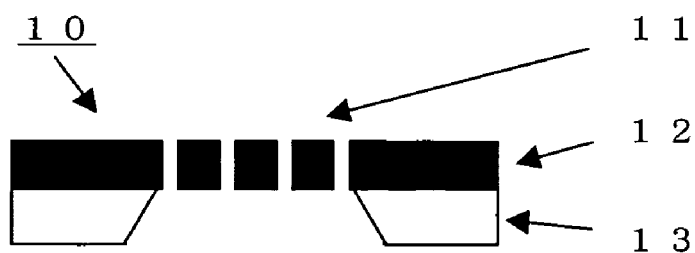

Hereinafter, the present invention will be explained.

Through assiduous studies, inventors of the present invention conceived that if at least a stencil portion of a stencil mask for ion implantation has a diamond layer, ion implantation of high precision and high purity can be performed for a long time in an ion implantation process since diamond has high resistance to ion irradiation due to high covalent bonding strength, and accordingly, they accomplished the present invention.

Hereinafter, the embodiment of the present invention will be explained in detail, but the present invention is not limited thereto.

The stencil mask for ion implantation of the present invention used in an ion implantation process of semiconductor device fabrication comprises at least a base material portion and a stencil portion, and the stencil portion has a diamond layer.

FIG. 1 shows an example of such a stencil mask for ion implantation of the present invention.

This stencil mask 10 for ion implantation has a structure in which a stencil portion 12 having a diamond layer stencilized in a desired pattern 11 is supported by a base material portion 13 made of silicon or the like of which center part is eliminated.

As described above, if the stencil mask for ion implantation of which stencil portion has a diamond layer is used, variation of stress in the stencil portion is small and atoms in the stencil portion are not implanted as impurities into a semiconductor device even if the stencil mask is irradiated with ions for a long time in an ion implantation process of the semiconductor device fabrication. As described above, since the diamond in the stencil portion is the material having high resistance to ion irradiation, ion implantation of high precision and high purity can be stably performed for a long time, and effects of improvement of the production yield of a semiconductor device and decrease in the production cost can be obtained.

In addition, it is preferable that the diamond layer in the stencil portion has a thickness within a range of 0.1–30.0 μm. If the diamond layer has a thickness of 0.1 μm or more, a masking effect against ions can be surely obtained in the ion implantation. On the other hand, if the diamond layer has a thickness of 30 μm or less, since a range of ions is not over the above thickness in general and thus it is not necessary to form the diamond layer having an excess thickness, the thickness of the above range is also advantageous in terms of the production cost of the diamond layer.

In this case, since the stencil portion is irradiated with ions serving as charged particles in the ion implantation, there is the possibility that the ion implantation of high precision is not preformed due to charge storage if electrical conductivity of the stencil portion is low. Accordingly, through assiduous studies, the inventors of the present invention found that when a diamond constituting a whole or a part of the diamond layer in the stencil portion has an electrical resistivity of $10^{13}$ Ω·cm or less at 20° C., the charge storage can be surely prevented.

Namely, the present invention provides the stencil mask for ion implantation, wherein a whole or a part of the diamond layer in the stencil portion comprises a diamond having electroconductive property, and the diamond having electroconductive property has an electrical resistivity of $10^{13}$ Ω·cm or less at 20° C.

Such a stencil mask for ion implantation can surely prevent charge storage in the stencil portion in an ion implantation process of semiconductor device fabrication, and ion implantation of high precision can be performed for a long time.

Particularly, in the ion implantation process, charges are easily stored on the surface of the diamond layer. In order to prevent the charge storage, it is preferable that the diamond having electroconductive property is formed on a whole surface or a part of a surface of the diamond layer, and the diamond has a thickness of 25.0 μm or less. According to the above, the charge storage can be further prevented effectively. And, since the other part of the diamond layer, particularly a bulk part, comprises a diamond of high purity, an excellent characteristics of diamond such as high resistance to ion irradiation can be utilized as it is. Moreover, when a dopant is used to add electroconductive property to the diamond, since an amount of the dopant used can be reduced as a whole, degradation of crystallinity of the diamond can be suppressed to a minimum, and the effect of cost reduction can be obtained.

In addition, if a dopant for the diamond having electroconductive property is boron or phosphorous, since diamond can be relatively easily doped with each dopant, the electrical resistivity of the diamond can be easily controlled to a desired electrical resistivity.

On the other hand, the present invention can also provide a stencil mask for ion implantation, wherein a material having electroconductive property other than a diamond is formed on a whole surface or a part of a surface of the diamond layer in the stencil portion, and the material having electroconductive property has an electrical resistivity of $10^{13}$ Ω·cm or less at 20° C. and a thickness within a range of 0.001–2.000 μm.

If such a stencil mask for ion implantation is used, since the diamond layer comprises a diamond of high purity, an excellent characteristic of diamond such as high resistance to ion irradiation due to high covalent bonding strength can be sufficiently utilized. And, since charges are easily stored particularly on the surface of the diamond layer in the ion implantation process, by comprising the material having electroconductive property on the diamond layer, charge store can be effectively prevented and decrease in ion implantation precision can be prevented for a long time. In addition, as described above, if the material having electroconductive property has an electrical resistivity of $10^{13}$ Ω·cm or less at 20° C. and a thickness within a range of 0.001–2.000 μm, the charge store can be surely prevented.

Regarding the above material having electroconductive property, there can be given a simple substance or a compound selected from the group consisting of Si, Sic, SiN, C without a diamond structure, Ti, Cr, Mo, Ru, Rh, Ag, In, Sn, Ta, W, Ir, Pt, and Au, as examples. These materials can surely suppress the charge storage to the stencil mask for ion implantation in the ion implantation, and they have the sufficient effect on a longer life of the mask.

Hereinafter, the production method of the stencil mask for ion implantation of the present invention will be explained in reference to FIG. 2. However the production method is not limited thereto.

First, as shown in FIG. 2(a), a base material 26 such as a silicon wafer is prepared.

Next, as shown in FIG. 2(b), a stencil portion 12 is formed on the base material 26. In the present invention, this stencil portion 12 has a diamond layer.

Regarding film formation methods of such a diamond layer, a vapor phase synthetic method is given as an example. In this case, the film formation method of the diamond layer by a vapor phase synthetic method will be explained.

First, when a diamond layer is formed on a base material, diamond particles are placed on a surface of the base material, and thereby, nuclei generation density of a diamond can be increased, and thus, a vapor phase synthetic diamond can be easily formed. Accordingly, in order to obtain a thin and a uniform continuous film, it is effective to seed diamond particles onto the surface of the base material as a pretreatment by an application of a diamond slurry onto the surface of the base material, a supersonic treatment with a diamond slurry, a scratch treatment with diamond particles, or the like.

On the base material after the above pretreatment, a diamond layer can be formed by a vapor phase synthetic method using DC arc discharge, DC glow discharge, combustion flame, Radio Frequency wave (RF), microwave, hot filament or the like, for example, as an energy source. Particularly, a microwave CVD method and a hot filament CVD method are preferable since a diamond layer having a large area and good crystallinity can be formed.

Hereinafter, a film formation method of the diamond layer by a microwave CVD method will be explained in reference to a microwave CVD apparatus shown in FIG. 3.

In the microwave CVD apparatus 20, a stage 25 equipped with a heating means such as a heater is located in a chamber 23 provided with a gas inlet pipe 21 and a gas outlet pipe 22. A microwave source 27 is connected to a microwave introducing aperture 24 via a waveguide 28 so as to generate plasma in the chamber 23.

A diamond layer is formed using the microwave CVD apparatus 20 as follows. First, a base material 26 on which a diamond film is to be formed is placed on the stage 25, and after that, pressure in the chamber 23 is reduced using a rotary pump not shown to be evacuated. Then, a raw material gas (methane gas+hydrogen gas, for example) is introduced at a desired flow from the gas inlet pipe 21 into the chamber 23. At this point, a gas containing an element of a predetermined dopant (for example, $B(OCH_3)_3$, diborane ($B_2H_6$), phosphine ($Ph_3$) or the like) is added to the raw material gas, and thereby, a diamond can be doped with the dopant. Next, after a bulb of the gas outlet pipe 22 is adjusted to make a pressure in the chamber 23 predetermined, a microwave is applied from the microwave source 27 and the waveguide 28 so as to generate plasma in the chamber 23 and form a diamond layer on the base material 26. If the dopant gas is introduced only in the latter half of the CVD reaction, only the surface of the diamond layer can have electroconductive property.

Next, as shown in FIG. 2(c), the base material 26 is subjected to masking except a center part of a back surface thereof, and the back surface is subjected to etching by a wet etching method with a KOH aqueous solution, an HF acid or the like so as to form a base material portion 13.

And, as shown in FIG. 2(d), the stencil portion 12 is patterned in a desired pattern 11 by a dry etching or the like so as to complete a stencil mask 10 for ion implantation.

EXAMPLE

Hereinafter, the present invention will be explained in detail in reference to Examples and Comparative Example.

Example 1

A stencil mask for ion implantation was manufactured in a manufacturing procedure as shown in FIG. 2.

A double side polished single crystal silicon wafer having a diameter of 100 mm, a thickness of 1 mm, and orientation of <100> was prepared as a base material 26 (FIG. 2(a)).

And a diamond layer was formed on the base material 26 through a pretreatment process and a film formation process.

In the pretreatment process, in order to improve nuclei generation density of a diamond, the following pretreatment was performed.

First, the base material was held by vacuum sucking on a spin coater, and a slurry of 50 ml including diamond particles (clustered diamonds having an average diameter of 50 nm) was dropped on a surface of the base material.

Then, the base material was rotated in a rotation rate of 3000 rpm for 30 seconds, so that the slurry including diamond particles was applied uniformly on the surface of the base material. After that, the base material was dried naturally to form a diamond-seeded layer on the surface of the base material.

Next, in the film formation process after the above pretreatment process, a diamond layer was formed on the pretreated base material by a microwave CVD method.

Figure 3:
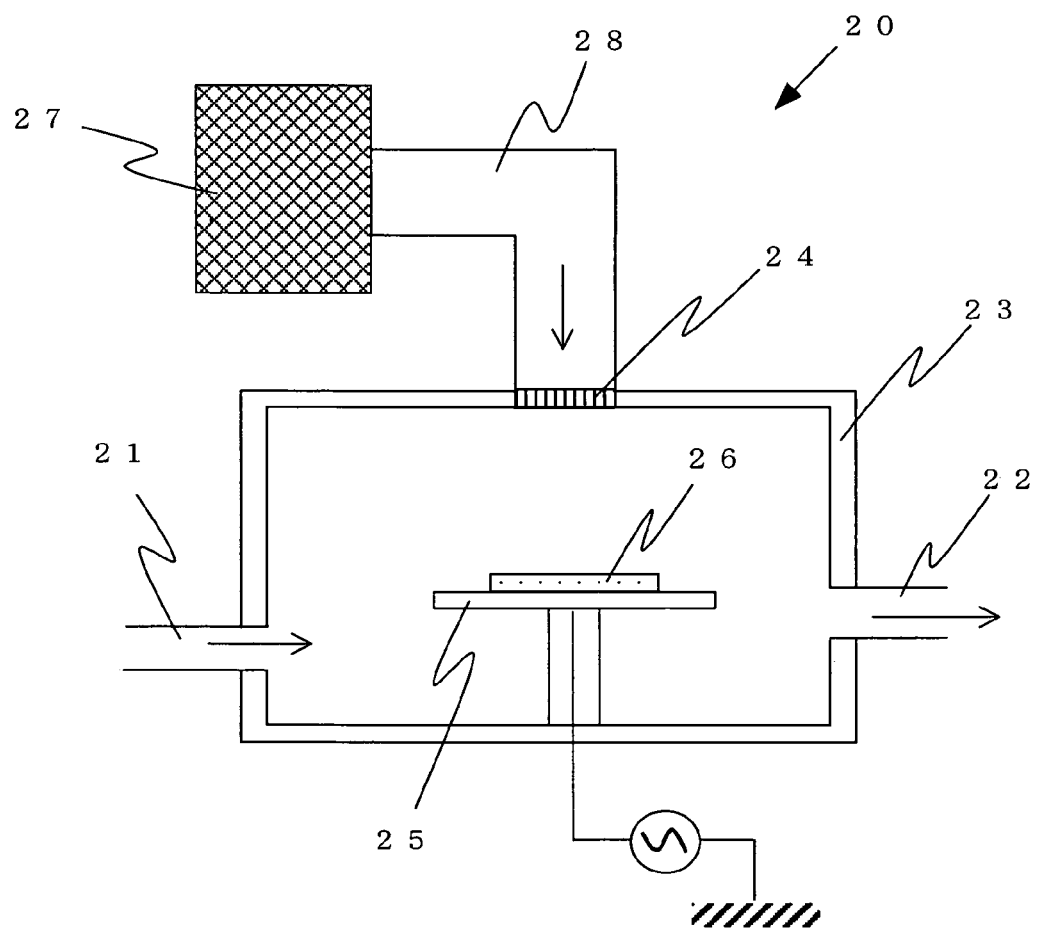
FIG. 3 is a schematic view showing an example of a microwave CVD apparatus.

First, the base material 26 pretreated was set on a base material stage 25 in a chamber 23 of the microwave CVD apparatus shown in FIG. 3.

Subsequently, after the chamber 23 was exhausted in a reduced-pressure state of $10^{-3}$ Torr or less through a rotary pump, a raw material gas composed of methane gas, hydrogen gas, and $B(OCH_3)_3$ gas was supplied from a gas inlet pipe 21 to the chamber 23. As for each gas introduced into the chamber 23, methane gas was 40.0 sccm, hydrogen gas was 950.0 sccm, and B(OCH3)3 gas was 10.0 sccm, and a volume ratio thereof was set to be methane gas/hydrogen gas/$B(OCH_3)_3$ gas=4.0/95.0/1.0.

And then, the inside of the chamber 23 was controlled to be 20 Torr by adjusting a valve provided in a gas outlet pipe 22, plasma was generated by applying a microwave of 3000 W from a microwave source 27, and thereby, formation of a boron doped diamond layer was performed on the base material for 19 hours. During the formation of the diamond layer, the base material generated heat due to microwave absorption and its surface temperature reached to 860° C.

Next, thus obtained boron doped diamond layer was subjected to a polishing process to form a stencil portion 12 (FIG. 2(b)).

After the polishing process, a center region of 35 mm square in the stencil portion 12 made of the diamond layer had a thickness of 10 µm and a surface roughness Ra of 2 nm, and when an electrical resistivity of the stencil portion 12 made of the diamond layer was measured, it was 200 Ω·cm or less at 20° C.

After that, the base material 26 was subjected to wet etching from the back side of the base material 26 with a KOH aqueous solution having a temperature of 95° C. to form a base material portion 13 so that a diamond membrane could have a shape of 35 mm square (FIG. 2(c)). Moreover, the diamond membrane was subjected to plasma etching with gas containing oxygen so that the diamond membrane has a desired pattern 11, and a stencil mask 10 was completed (FIG. 2(d)).

The stencil mask 10 for ion implantation of which stencil portion 12 was composed of the diamond layer was used for an actual implantation at 100 keV with $B^+$ ions. As a result, even when ions of $10^{21}$ ions/cm$^2$ were implanted, the precision of a pattern position was 4 nm or less, and contamination due to C was 10 ppm or less with respect to the number of atomic ions implanted. And, no decrease in the implantation precision due to charge storage was generated in the ion implantation. Therefore, it was confirmed that the stencil mask for ion implantation of the present invention had extremely high resistance to ion irradiation.

Example 2

A stencil mask for ion implantation was produced by the same procedure as in Example 1 except that in the film formation process of the diamond layer by the microwave CVD method, $B(OCH_3)_3$ gas was introduced as a dopant for the last two hours during the film formation so that only the surface of the diamond layer could contain a diamond having electroconductive property.

The stencil mask for ion implantation of which stencil portion was composed of the diamond layer (only the surface of the diamond layer had electroconductive property) was used for an actual implantation at 100 keV with $B^+$ ions. As a result, even when ions of $10^{21}$ ions/cm$^2$ were implanted, the precision of a pattern position was 2 nm or less, and contamination due to C was 7 ppm or less with respect to the number of atomic ions implanted. And, no decrease in the implantation precision due to charge storage was generated in the ion implantation. Therefore, it was confirmed that this stencil mask for ion implantation had extremely higher resistance to ion irradiation as compared with Example 1.

Comparative Example 1

An SOI substrate having a diameter of 100 mm and composed of a base layer made of silicon with a thickness of 1 mm, an insulator layer (SiO$_2$ layer) serving as an intermediate layer with a thickness of 0.5 µm, and an upper silicon layer with a thickness of 10 µm was prepared. The upper silicon layer has an electrical resistivity of 200 Ω·cm at 20° C. A center part of the base layer on the back surface of the substrate was eliminated by etching with a KOH aqueous solution having a temperature of 95° C. so that the upper silicon layer remained in a desired shape as a membrane. Subsequently, the SiO$_2$ layer serving as an intermediate layer was eliminated by etching with a 50% HF acid. Thereby, the upper silicon layer became a membrane of 35 mm square, and it was supported on a frame of the base layer (base material portion). After that, the silicon membrane of 35 mm square was patterned in a desired pattern by plasma etching with gas containing CF$_4$ to complete a stencil mask for ion implantation.

The stencil mask for ion implantation of which stencil portion was composed of the silicon layer was used for an actual implantation at 100 keV with B$^+$ions as in Example 1. As a result, when ions of $10^{15}$ ions/cm$^2$ were implanted, its pattern position was distorted at 500 µm or more, and contamination of silicon was 15 ppm or more with respect to the number of atomic ions implanted. Since the stencil portion was composed of the silicon layer having electroconductive property, charge store was not generated. However, its resistance to ion irradiation was lowered, and its practical utility was considerably inferior to the stencil mask as in Example 1.

The present invention is not limited to the above-described embodiments. The above-described embodiments are a mere example, and those having substantially the same structure as that described in the appended claims and providing the similar action and effects are included in the scope of the present invention.

What is claimed is:

1. A stencil mask for ion implantation used in an ion implantation process of semiconductor device fabrication comprising at least a base material portion and a stencil portion, wherein the stencil portion has a diamond layer and wherein a whole or a part of the diamond layer comprises a diamond having electroconductive property, and the diamond having electroconductive property has an electrical resistivity of $10^{13}$ Ω·cm or less at 20° C.

2. The stencil mask for ion implantation according to claim 1, wherein the diamond layer has a thickness within a range of 0.1–30.0 μm.

3. The stencil mask for ion implantation according to claim 1, wherein the diamond having electroconductive property, which constitutes a part of the diamond layer, is formed on a whole surface or a part of a surface of the diamond layer, and has a thickness of 25.0 μm or less.

4. The stencil mask for ion implantation according to claim 2, wherein the diamond having electroconductive property, which constitutes a part of the diamond layer, is formed on a whole surface or a part of a surface of the diamond layer, and has a thickness of 25.0 μm or less.

5. The stencil mask for ion implantation according to claim 1, wherein a dopant for the diamond having electroconductive property is boron or phosphorous.

6. The stencil mask for ion implantation according to claim 2, wherein a dopant for the diamond having electroconductive property is boron or phosphorous.

7. The stencil mask for ion implantation according to claim 3, wherein a dopant for the diamond having electroconductive property is boron or phosphorous.

8. The stencil mask for ion implantation according to claim 4, wherein a dopant for the diamond having electroconductive property is boron or phosphorous.

9. The stencil mask for ion implantation according to claim 1, wherein a material having electroconductive property other than a diamond is formed on a whole surface or a part of a surface of the diamond layer, and the material having electroconductive property has an electrical resistivity of $10^{13}$ Ω·cm or less at 20° C. and a thickness within a range of 0.001–2.000 μm.

10. The stencil mask for ion implantation according to claim 2, wherein a material having electroconductive property other than a diamond is formed on a whole surface or a part of a surface of the diamond layer, and the material having electroconductive property has an electrical resistivity of $10^{13}$ Ω·cm or less at 20° C. and a thickness within a range of 0.001–2.000 μm.

11. The stencil mask for ion implantation according to claim 9, wherein the material having electroconductive property comprises a simple substance or a compound selected from the group consisting of Si, SiC, SiN, C without a diamond structure, Ti, Cr, Mo, Ru, Rh, Ag, In, Sn, To, W, Ir, Pt, and Au.

12. The stencil mask for ion implantation according to claim 10, wherein the material having electroconductive property comprises a simple substance or a compound selected from the group consisting of Si, SiC, SiN, C without a diamond structure, Ti, Cr, Mo, Ru, Rh, Ag, In, Sn, Ta, W, Ir, Pt, and Au.

* * * * *